United States Patent
Hofmeister et al.

(10) Patent No.: US 7,440,865 B1
(45) Date of Patent: Oct. 21, 2008

(54) SCREENING OPTICAL TRANSCEIVER MODULES FOR ELECTROSTATIC DISCHARGE DAMAGE

(75) Inventors: Rudolf J. Hofmeister, Sunnyvale, CA (US); Song Miao, San Jose, CA (US); Andreas Weber, Los Altos, CA (US); William Freeman, Castro Valley, CA (US)

(73) Assignee: Finisar Corporation, Sunnyvale, CA (US)

( * ) Notice: Subject to any disclaimer, the term of this patent is extended or adjusted under 35 U.S.C. 154(b) by 425 days.

(21) Appl. No.: 10/771,083

(22) Filed: Feb. 3, 2004

Related U.S. Application Data

(60) Provisional application No. 60/444,486, filed on Feb. 3, 2003.

(51) Int. Cl.
 *G01R 27/28* (2006.01)
 *H04B 10/00* (2006.01)

(52) U.S. Cl. ...................................... 702/120; 398/135

(58) Field of Classification Search ................. 702/120, 702/85, 104, 108, 117; 372/38.1, 50, 38.02, 372/26, 29.021, 50.124; 257/688; 385/92, 385/93; 398/135, 182, 186; 438/13, 79, 438/82

See application file for complete search history.

(56) References Cited

U.S. PATENT DOCUMENTS

| | | | | |
|---|---|---|---|---|
| 4,639,924 A | * | 1/1987 | Tsunekawa | ................... 372/33 |
| 5,019,769 A | * | 5/1991 | Levinson | .................... 372/31 |
| 5,523,252 A | * | 6/1996 | Saito | ........................... 438/18 |
| 5,579,328 A | * | 11/1996 | Habel et al. | ................... 372/31 |
| 5,602,665 A | * | 2/1997 | Asako | ........................ 398/137 |
| 5,608,572 A | * | 3/1997 | Nitta et al. | ................... 359/344 |
| 5,802,089 A | * | 9/1998 | Link | ........................ 372/38.02 |
| 6,013,923 A | * | 1/2000 | Huang | .......................... 257/59 |
| 6,014,392 A | * | 1/2000 | Imai et al. | ................. 372/38.02 |
| 6,160,834 A | * | 12/2000 | Scott | ............................ 372/96 |
| 6,185,240 B1 | * | 2/2001 | Jiang et al. | ..................... 372/50 |
| 6,195,371 B1 | * | 2/2001 | Haneda et al. | ........... 372/29.01 |
| 6,261,130 B1 | * | 7/2001 | Huynh et al. | ............... 439/700 |

(Continued)

OTHER PUBLICATIONS

Kimura et al., A Novel Transmitter/Receiver Switching Circuit Configuration for High-Performance LD Transceiver in Subscriber Loop, Jul. 1996, Journal of Lightwave Technology, vol. 14, No. 7, pp. 1644-1652.*

(Continued)

*Primary Examiner*—Michael P. Nghiem
*Assistant Examiner*—Toan M Le
(74) *Attorney, Agent, or Firm*—Workman Nydegger

(57) ABSTRACT

A general method is given for screening laser diodes for electrostatic discharge, (ESD), damage. The laser diode may be selectively isolated from the laser driver so that a current-voltage (I-V), curve can be taken and then compared to curves taken previously on the same laser diode to ascertain the possibility of ESD damage. Presumably the initial I-V curve will be representative of the characteristics of that particular laser in the undamaged state. Such an initial curve may be supplied by the manufacturer and may be a curve specific to a particular laser diode. Comparison with a standard curve is not sufficient to determine ESD damage in the early stages of failure. Some embodiments focus on isolating the laser diode from the laser driver, storing the information locally in the transceiver, and providing some analysis resulting in flagging laser diodes showing changes that are indicative of ESD damage.

28 Claims, 3 Drawing Sheets

U.S. PATENT DOCUMENTS

| | | | |
|---|---|---|---|
| 6,272,160 B1* | 8/2001 | Stronczer | 372/38.02 |
| 6,351,481 B1* | 2/2002 | Marcomber et al. | 372/50 |
| 6,489,232 B1* | 12/2002 | Derkits et al. | 438/637 |
| 6,560,258 B1* | 5/2003 | McQuilkin | 372/38.02 |
| 6,592,269 B1* | 7/2003 | Brophy et al. | 385/92 |
| 6,678,292 B2* | 1/2004 | Wickstrom et al. | 372/32 |
| 6,697,400 B2* | 2/2004 | Nomura | 372/38.02 |
| 6,771,679 B2* | 8/2004 | Schie | 372/38.1 |
| 6,798,797 B2* | 9/2004 | Mangano et al. | 372/29.01 |
| 6,802,654 B1* | 10/2004 | Roberts et al. | 385/88 |
| 6,819,697 B2* | 11/2004 | Widjaja et al. | 372/46.013 |
| 6,862,302 B2* | 3/2005 | Chieng et al. | 372/29.02 |
| 6,862,306 B2* | 3/2005 | Shimizu | 372/38.02 |
| 6,907,055 B2* | 6/2005 | Morley et al. | 372/38.1 |
| 6,947,456 B2* | 9/2005 | Chin et al. | 372/38.02 |
| 7,020,169 B2* | 3/2006 | Nishimura et al. | 372/38.02 |
| 7,035,302 B2* | 4/2006 | Tanaka et al. | 372/38.02 |
| 2004/0136422 A1* | 7/2004 | Mahowald et al. | 372/38.02 |

OTHER PUBLICATIONS

Neitzert et al., Sensitivity of Proton Implanted VCSELs to electrostatic Discharge Pulses, Mar./Apr. 2001, IEEE Journal on Selected Topics in Quantum Electronics, vol. 7, No. 2, pp. 231-241.*

Kazlas et al., Monolithic Vertical-Cavity Laser/p-i-n Photodiode Transceiver Array for Optical Interconnects, Nov. 1998, IEEE Photonics Technology Letters, vol. 10, No. 11, pp. 1530-1532.*

\* cited by examiner

SCREENING OPTICAL TRANSCEIVER MODULES FOR ELECTROSTATIC DISCHARGE DAMAGE

CROSS REFERENCE TO RELATED APPLICATION

This application claims the benefit of U.S. Provisional Application No. 60/444,486 filed Feb. 3, 2003 which is incorporated herein by reference.

BACKGROUND OF THE INVENTION

1. The Field of the Invention

The present invention relates to screening vertical cavity surface emitting lasers (VCSELs) for quality control purposes. More specifically, the invention relates to methods and apparatus for testing VCSELs that have been installed in transceiver modules in which damage to the laser may have taken place either during the installation into the transceiver module or some time after installation into the transceiver module.

2. Description of the Related Art

In the field of data transmission, one method of efficiently transporting data is through the use of optical fibers. Digital data is propagated through a fiber optic cable using light emitting diodes or lasers. Light signals allow for extremely high transmission rates and very high bandwidth capabilities. Also, light signals are resistant to electromagnetic interferences that would otherwise interfere with electrical signals. Light signals are more secure because they do not allow portions of the signal to escape from the fiber optic cable as can occur with electrical signals in wire-based systems. While there may be an evanescent field that enables one to siphon some portion of the light off the fiber by bending the fiber such that it is possible to tap fiber communications without breaking the fiber, it is in general much more difficult than for electrical communications. Light also can be conducted over greater distances without the signal loss typically associated with electrical signals on copper wire.

To accomplish communication in a fiber optic network, one component that is used is a transceiver module. A transceiver module has an optical input port and an optical output port. The optical input port is typically connected to a photodiode. The photodiode is connected to control circuitry within the transceiver module such that the combination of the photodiode and control circuitry can be used to monitor optical data received from the fiber optic network.

The optical output port typically is connected to a laser or a laser diode. The laser is also connected to the control circuitry. By modulating the signals to the light emitting diode or laser diode, digital optical data can be propagated from the transceiver module onto the fiber-optic network. The transceiver module also typically includes components for converting optical signals to electrical signals and electrical signals to optical signals so that electrical components in the network can communicate with the optical portions of the network.

In an 850 nanometer fiber-optic transceiver module, a particular laser known as a vertical cavity surface emitting laser (VCSEL) is often used. The emitting area of a VCSEL is defined by where the current flows through the quantum well region. Since the VCSEL is created as a uniform planar structure there is nothing initially to determine where the current will go. The two most common methods of solving this problem are: 1) disrupting the lattice structure by particle implantation (usually hydrogen, i.e., protons), which causes the current to preferentially flow through the non-disrupted region defined by the negative image of the implantation mask and 2) blocking the current by creating a dielectric oxide layer in the region surrounding the emitting cavity, commonly known as the oxide confinement technique. In recent times, the technique of oxide confinement has been used to create a variety of oxide laser diodes known as oxide defined vertical cavity surface emitting lasers more commonly known as oxide VCSELs. While the oxide lasers diodes exhibit some desirable characteristics, they also have the unfortunate drawback of being very susceptible to electrostatic discharge (ESD) damage. This is easy to predict since the lattice disruption confinement technique disrupts the layers all the way through the VCSEL structure, while the oxide confinement technique only creates a very thin dielectric layer. For any given applied voltage, the electric field strength will be proportional to the thickness of the dielectric region, so the thin oxide layer will have a much higher field across it and sustain damage at a lower voltage than the thick implanted layers. Whereas most typical electronics have an ESD resistance of least 500 V and often much higher, the oxide VCSEL is susceptible to ESD damage at voltages as low as 200 V or less. Another difficulty with ESD damage to oxide VCSELs is that such damage is often latent, meaning that it is not immediately detectable simply by observing the initial performance of the oxide VCSEL. However, ESD damage causes the oxide VCSEL to quickly degrade.

One method of screening oxide VCSELs to verify that they have not been damaged by an ESD is by examining the current/voltage characteristics of the oxide VCSEL. These characteristics are often shown in an I-V graph. By comparing the current/voltage characteristics of oxide VCSELs that are known to be operable and undamaged with the oxide VCSEL under test, one may be able to make a determination as to whether the oxide VCSEL under test has been damaged by ESD. Often, however, because the change in the current/voltage characteristics may be slight when ESD damage has taken place on an oxide VCSEL, the testing of the oxide VCSEL may need to be performed over time to ensure that there is no change in the current/voltage characteristics of the particular oxide VCSEL. In other words, it may not be sufficient to compare the current/voltage characteristics of the oxide VCSEL under test with known current/voltage characteristics, because oxide VCSELs have inherent variation in their current/voltage characteristics. Electrostatic discharge damage to an oxide VCSEL may appear to be simply a device variation.

While presently it is possible to use such testing to evaluate the condition of the oxide VCSEL prior to the oxide VCSEL being installed in another component such as a transceiver module, once the oxide VCSEL has been installed in another component testing can be much more difficult. Further exacerbating the problems with testing oxide VCSELs is the fact that installation of the oxide VCSEL into other components may actually be the cause of the ESD that damages the oxide VCSEL. It would therefore be beneficial if testing of the oxide VCSEL could be performed after the oxide VCSEL has been installed in another component or after the other component has been in service for a period of time.

BRIEF SUMMARY OF THE INVENTION

One embodiment of the invention includes a transceiver module incorporating a laser diode. The transceiver module further includes selectable switches for disconnecting the laser diode from other circuitry in the transceiver. External test pins are connected to the laser diode such that when the laser diode is disconnected from other circuitry in the transceiver module, testing can be done on the laser diode to detect electrostatic discharge damage.

Another embodiment of the invention includes a transceiver module that includes a laser diode coupled through a laser driver to a microprocessor. Memory is also connected to the microprocessor for storing reference operating characteristics. The microprocessor is able to collect periodic operating characteristics of the laser diode. These periodic operating characteristics can be compared to the reference operating characteristics to detect damage to the laser diode.

Another embodiment of the invention includes a laser diode coupled through a laser driver to a microprocessor. Memory is connected to the microprocessor. The microprocessor is able to collect periodic operating characteristics at different times and store the periodic operating characteristics in the memory. Subsequently, operating characteristics taken at different times can be compared to detect damage to the laser diode.

Other embodiments of the invention include methods for manufacturing transceivers. One method includes connecting a laser diode to a laser driver. The laser driver is connected to a microprocessor. Memory is connected to the microprocessor. Reference operating characteristics for the laser diode are stored in the memory. The microprocessor is configured, such as through programming, to collect periodic operating characteristics and to compare those operating characteristics to the reference operating characteristics stored in the memory.

BRIEF DESCRIPTION OF THE SEVERAL VIEWS OF THE DRAWINGS

In order that the manner in which advantages and features of the invention are obtained, a description of the invention will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Embodiments of the present invention provide apparatus for testing a laser diode including oxide VCSELs, which have been installed in transceivers, over time to determine if damage has occurred to the laser diode. One embodiment of the invention allows for the laser diode to be separated from other circuitry such that test equipment can be attached to the laser diode. An operating characteristic such as current/voltage characteristics or current versus optical power characteristics of the laser diode can be measured and recorded for comparison with subsequent measurements or a reference measurement. In another embodiment of the invention, a laser driver in the transceiver includes circuitry for measuring current/voltage, current versus power and/or other characteristics of the laser diode. The measured characteristics may be stored in memory on the transceiver for comparison, with subsequent measurements or a reference measurement. The comparison may be accomplished by using a microprocessor. While the following discussion references oxide VCSELs, the invention is not limited only to oxide VCSELs. Other types of laser diodes may also be used.

Figure 1:
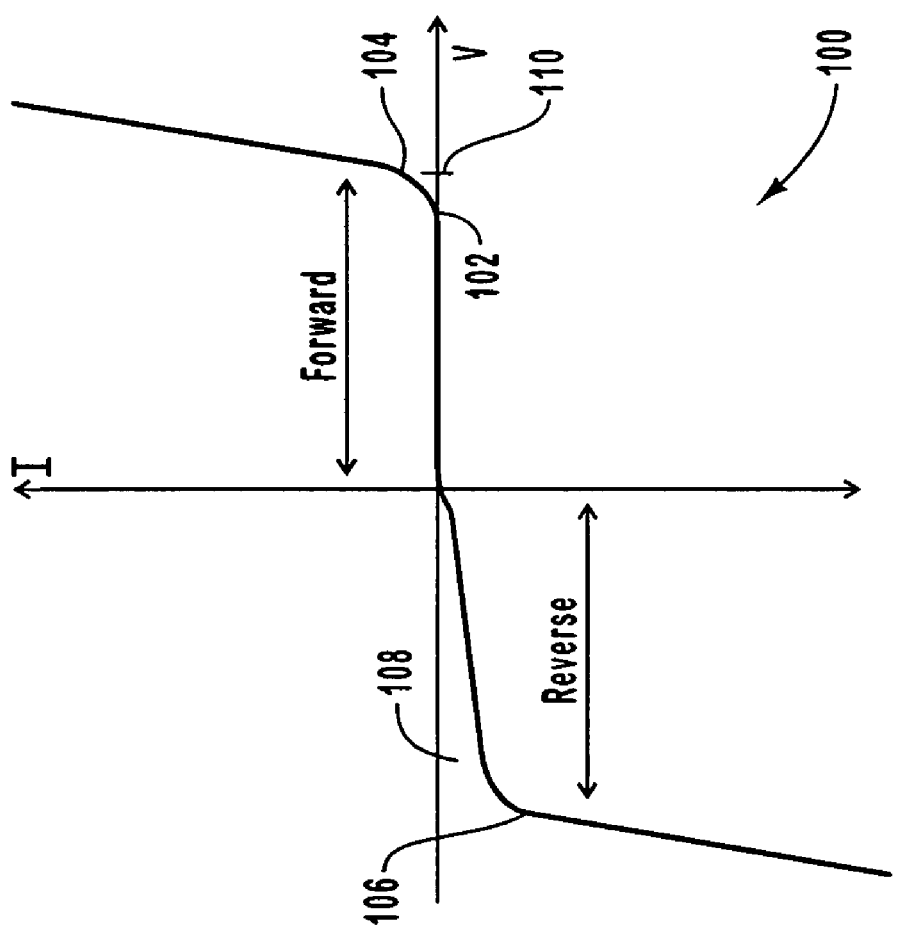
FIG. 1 illustrates the voltage/current characteristics of a typical oxide VCSEL shown using an I-V graph.

An exemplary I-V graph is shown in FIG. 1 and generally designated as 100. I-V graph 100 is a voltage plot along the horizontal axis, with the corresponding current plotted on the vertical axis. The oxide VCSEL is screened by monitoring how the current through the oxide VCSEL reacts as a bias voltage across the oxide VCSEL is increased. For example, in a forward bias test, the voltage across the oxide VCSEL is gradually increased. The current through the oxide VCSEL is negligible until the voltage across the laser diode reaches a point known as the cut-in voltage 102. This point is generally difficult to determine accurately, but the log-linear slope after the forward the forward bias knee 104 is easy to measure accurately. Extrapolating this slope back to the horizontal voltage axis gives a value usually referred to as the threshold voltage 110. Threshold voltage is a more reliable and more easily determined number for comparison than cut-in voltage 102. The current through the laser diode then increases exponentially in a manner as illustrated by a forward bias knee 104. By monitoring such characteristics as the cut-in voltage 102 and the forward threshold voltage 110 and comparing these characteristics either with oxide VCSEL reference characteristics that are known to be good or with the reference characteristics of the oxide VCSEL under test when it was known to be good, the condition of the oxide VCSEL can be ascertained. Similar testing can be done by applying a reverse bias voltage to the oxide VCSEL. The reverse bias testing is similar to the forward bias testing except that the breakdown voltage 106, reverse bias knee 108 and/or a reverse threshold voltage are monitored to determine the condition of the oxide VCSEL.

Figure 2:
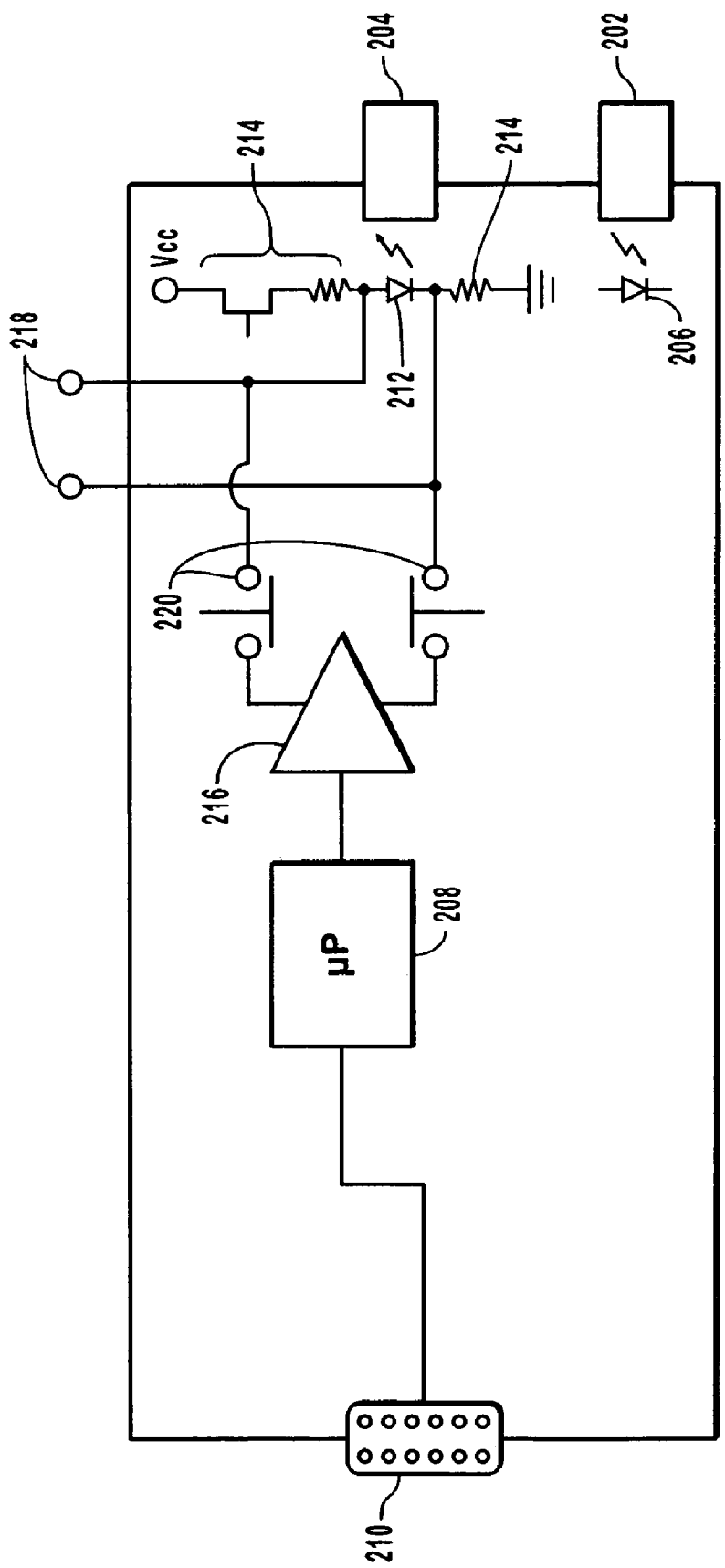
FIG. 2 illustrates a transceiver module that has external contact points for screening an oxide VCSEL installed in a transceiver module.

FIG. 2 shows an optical fiber transceiver module 200 that has an optical input port 202 and an optical output port 204. The optical input port 202 provides an interface point to a fiber optic network for a photodiode 206 that is installed in the transceiver module 200. The photodiode 206 may be connected to control circuitry, such as a microprocessor 208. The photodiode 206 receives optical signals representing data existing on a fiber optic network. This data can then be fed to the microprocessor 208, which is connected to a communications connector 210. The communications connector 210 is configured to connect to a communications bus on an electronic component that communicates with the optical components of the fiber optic network. In one embodiment of the invention the communications bus is an I²C bus.

The optical output port 204 is connected to a laser diode 212. The laser diode 212 is connected to biasing circuitry 214 that may be modulated for modulating the output of the laser diode 212. The modulated output of the laser diode 212 can be propagated through the optical output port 204 and onto the fiber optic network. The biasing circuitry 214 is connected to and controlled by a laser driver 216. The laser driver 216 is configured so that it is able to source the current needed to appropriately drive the laser diode 212. The laser driver 216 is connected to the microprocessor 208. The microprocessor 208 sends small signal values to the laser driver 216 to modulate the laser diode 212. The microprocessor 208 is connected to the communications connector 210 such that an electronic component connected to the transceiver module 200 through the communications connector 210 may propagate digital data on to the fiber optic network.

In one embodiment of the invention, test connections are made to the anode and cathode of the laser diode 212. The test connections are routed to external test pins 218 that may be, for example, pogo style pins. The test pins 218 are mounted such that they do not contact the metallic body of the transceiver module 200. The transceiver module 200 also has selectable switches 220 placed between the laser driver 216 and the laser diode 212, or within the laser driver 216 itself, for removing the laser diode 212 from other circuitry within the transceiver module 200. When the selectable switches 220 are in the open position, as shown in FIG. 2, the test pins 218 can be connected to external testing equipment to measure the current/voltage characteristics of the laser diode 212. In this way, testing of the laser diode 212 can be effectuated after the laser diode 212 has been installed in the transceiver module 200. While, in this example, the screening of the laser diode 212 makes use of the current/voltage characteristics, other tests may also be performed to measure other characteristics of the laser diode 212 that indicate ESD damage. The present embodiment provides a way to isolate the laser diode 212 from the other components in the transceiver module 200 such that appropriate screening can be performed.

Figure 3:
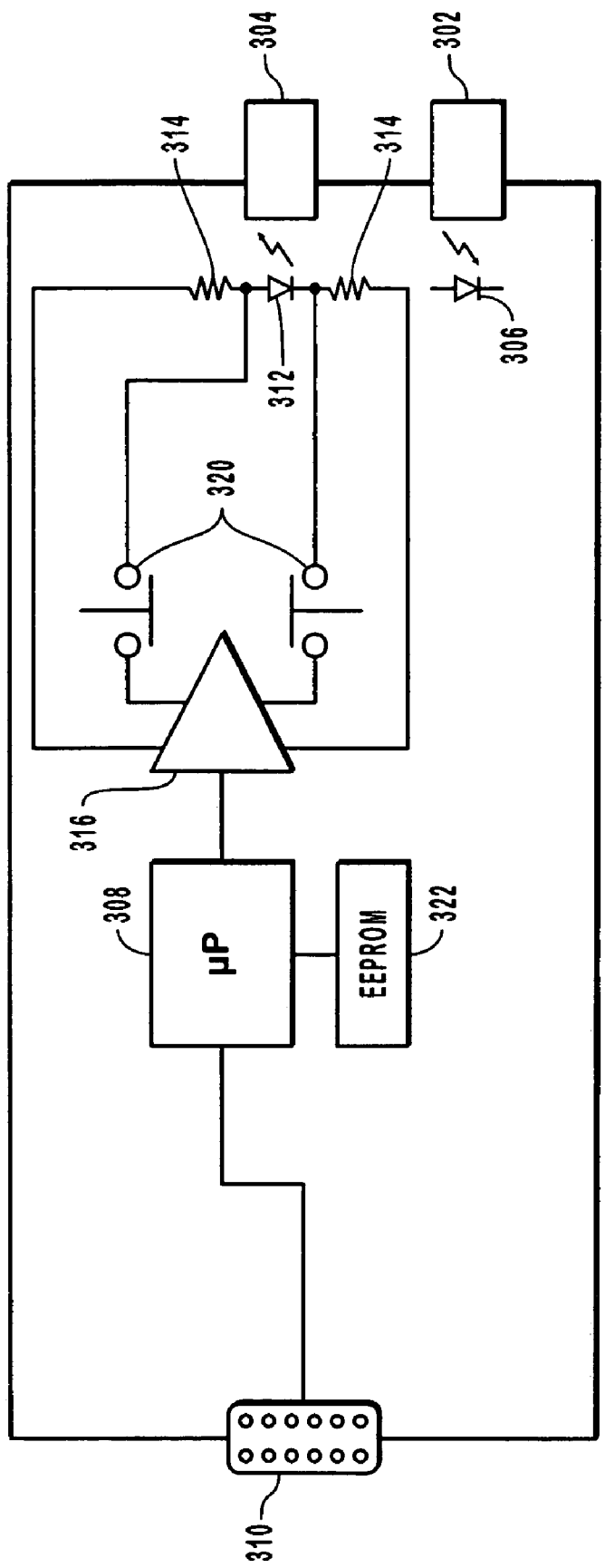
FIG. 3 illustrates a transceiver module wherein the control circuitry within the transceiver module is configured to perform a self-screening operation on the oxide VCSEL.

Referring now to FIG. 3, an alternate embodiment of the present invention is shown. FIG. 3 generally shows a transceiver module 300. As in FIG. 2, the transceiver module 300 has an optical input port 302 and an optical output port 304. A photodiode 306 is installed in the transceiver module 300 in a manner similar to that described for the photodiode 206 of FIG. 2. A laser diode 312 is installed and configured in the transceiver module 300 in a fashion similar to that of the laser diode 212 of FIG. 2. The laser driver 316 is connected to the laser diode 312 such that it is able to bias the laser diode 312 through two alternate paths. The first path is through the biasing circuitry 314, which path is used in the ordinary course of propagating digital data onto the fiber optic network. In a laser diode screening mode, the second path through selectable switches 320, which in one embodiment of the invention may be within the laser driver 316, can be used to periodically monitor current/voltage characteristics of the laser diode 312 by applying a varying voltage across the laser diode 312 and measuring the current through the laser diode 312. Periodic as used herein does not require the monitoring to be done at any specified interval, but rather that the monitoring is done repeatedly at different times. The monitoring may be done, for example, when a transceiver is powered up or at some other convenient time.

In the present embodiment, a microprocessor 308 is configured to collect the periodic current/voltage characteristics of the laser diode 312. This collected information can be compared to reference calibration characteristics stored in computer memory such as an electronically erasable programmable read only memory (EEPROM) 322 that is connected to the microprocessor 308. The reference characteristics on the EEPROM 322 may be data collected about the particular laser diode 312 before it was installed into the transceiver module 300 and known to be in an undamaged condition. For example prior to installation, in one embodiment of the invention, reference I-V graphs may be generated for the laser diode 312 at three different temperatures. The results of these measurements may be stored as quadratic spline coefficients. Using quadratic spline coefficients minimizes the amount of data that needs to be stored on the EEPROM 322. Further, using quadratic spline coefficients allows the reference I-V graph to be easily interpolated. For example, I-V graphs at other temperatures for the laser diode 312 may be interpolated using the generated quadratic spline coefficients. Interpolated I-V graphs for any temperature between two extremes of the previously generated quadratic spline coefficients can then be generated. Additionally, testing at different temperatures allows ESD damage that behaves differently at different temperatures to be detected. Notably, ESD damage to an oxide layer may leave areas where tunneling causes significant conduction. Tunneling is temperature sensitive, such that comparing results at different temperatures may help to reveal ESD damage that might otherwise remain latent over a period of time.

The microprocessor 308 can be configured, such as by executing a program, to periodically collect and compare the current/voltage characteristics or to collect and compare the characteristics on the occurrence of some event, such as startup. Alternately, an electronic component connected to the transceiver module 300 through a communications connector 310 may issue a command to the microprocessor 380 to collect and compare the current/voltage characteristics of the laser diode 312. The microprocessor 308 may be further configured to compare successive characteristics taken at different times to evaluate the current/voltage characteristics of the laser diode 212 over time.

In one embodiment of the invention, the periodic current/voltage characteristics of the laser diode 212 may be recorded as cubic splines. The slope of the forward biased laser region (i.e. the region that includes the sloped line after the forward bias knee 104 in FIG. 1) and the threshold voltage (i.e. threshold voltage 110 in FIG. 1) can be generated and recorded from the cubic splines. These two pieces of information may be stored and compared over time to detect ESD damage by noting abnormal changes in threshold, efficiency, slope etc.

Additionally, while measuring the current characteristics, optical power from the laser diode could be measured from both a fiber coupled to the optical output port 304 and from an internal monitor diode. This would help to generate near perfect calibration of the monitor diode over temperature and power. For example, in one embodiment, when there is a suspected problem with a transceiver module, an end user may measure and compare optical power from the laser diode versus current as compared with previous measurements, such as a reference measurement taken prior to the installation of the laser diode in a transceiver. Periodic measurements may also be compared with previous periodic measurements to detect deterioration of a laser diode. Part of the reason for calibrating the laser monitor diode is to facilitate in-situ data collection. By using the monitor diode, the laser in a given TR can be tested without removing it from the system and without removing any of the optical or electronic connections.

If the microprocessor 308 detects patterns that tend to show damage to the laser diode 312, the microprocessor can set a general Tx fault flag. When a general Tx fault flag is set, the electronic component connected to the transceiver module 300 is notified that a problem exists with the transceiver module 300. In one embodiment, this general Tx fault flag is a data object stored in a memory map of the microprocessor 308 corresponding to an available memory cell according to the $I^2C$ communications protocol. When the electronic component becomes aware of the problem existing on the transceiver module 300, a polling routine may be performed to isolate the specific problems existing with the laser diode 312.

Alternately, the transceiver module 300 may notify the electronic component connected to the transceiver module 300 of a specific problem with the laser diode 312. In this manner, the laser diode 312 can be screened after the laser diode 312 has been installed in the transceiver module 300 and can continuously be screened throughout the service life of the transceiver module 300.

In an alternative embodiment of the invention, the laser driver 316 or an analog to digital converter on the microprocessor 308 can be used to determine the voltage applied to the laser diode 312 and the resulting current flow for determining the current/voltage characteristics of the laser diode 312. After a one time calibration of the laser driver 316, the current/voltage characteristics can be measured by sweeping each section of an I-V curve with the laser driver 316 while using the microprocessor 308 to control the DC bias on the laser. In this embodiment, the switches 320 are not used. Advantageously, this embodiment helps to eliminate various bit error rate challenges that may be caused by additional circuit board traces, electronic hardware or switching components.

While the present invention illustrates using the current/voltage characteristics and current versus power characteristics of the laser diode 312 to detect ESD damage, other operating characteristics may be tested as well using the apparatus described herein. The present invention may also be useful for detecting damage to other types of lasers including but not limited to Fabry-Perot lasers and distributed feed back (DFB) lasers. The present invention may be embodied in other specific forms without departing from its spirit or essential characteristics. The described embodiments are to be considered in all respects only as illustrative and not restrictive.

What is claimed is:

1. A transceiver module comprising:
   a laser diode;
   a laser driver coupled to the laser diode;
   a microprocessor coupled to the laser driver;
   memory coupled to the microprocessor, the memory comprising a reference operating characteristic of the laser diode;
   wherein the microprocessor is adapted to collect periodic operating characteristics of the laser diode and to compare the periodic operating characteristics of the laser diode to the reference operating characteristics of the laser diode; and
   wherein the laser diode and laser driver are arranged such that the laser driver can bias the laser diode through two alternate paths, wherein one of the paths includes a pair of switches arranged to enable selective coupling of the laser driver to the laser diode.

2. The transceiver module of claim 1, wherein the memory comprises an electronically erasable programmable read only memory.

3. The transceiver module of claim 1, wherein the reference operating characteristics of the laser diode are stored as quadratic spline coefficients.

4. The transceiver module of claim 1, wherein the reference and periodic operating characteristics of the laser diode comprise current/voltage characteristics.

5. The transceiver module of claim 1, wherein the reference and periodic operating characteristics of the laser diode comprise current versus optical power characteristics.

6. The transceiver module of claim 1, wherein the microprocessor is further adapted to store the periodic operating characteristics of the laser diode in the memory.

7. The transceiver module of claim 1, wherein the microprocessor is further adapted to store the periodic operating characteristics of the laser diode in the memory as cubic spline coefficients.

8. The transceiver module as recited in claim 1, further comprising:
   a pair of switches arranged to selectively couple both the laser driver and the microprocessor to the laser diode; and
   first and second external test pins coupled to respective first and second sides of the laser diode, the first and second external test pins arranged so as to be in communication with the laser diode regardless of whether the switches are open or closed.

9. The transceiver module as recited in claim 8, wherein when both switches are open, both the laser driver and the microprocessor are uncoupled from the laser diode.

10. The transceiver module as recited in claim 1, wherein the laser diode comprises an oxide laser.

11. A transceiver module comprising:
    a laser diode, wherein the laser diode comprises a vertical cavity surface emitting laser (VCSEL);
    a laser driver coupled to the laser diode;
    a microprocessor coupled to the laser driver;
    memory coupled to the microprocessor; and
    wherein the microprocessor is adapted to:
        collect periodic operating characteristics of the laser diode at various times;
        store the collected periodic operating characteristics of the laser diode in the memory;
        compare the periodic operating characteristics of the laser diode collected at least two different times to detect damage to the laser diode; and
        wherein the microprocessor is further configured to record the periodic operating characteristics as cubic splines to the memory.

12. The transceiver of claim 11, wherein the periodic operating characteristics comprise current/voltage characteristics.

13. The transceiver of claim 11, wherein the periodic operating characteristics comprise current versus optical power characteristics.

14. The transceiver of claim 11, wherein the microprocessor is further configured to set a fault flag when damage to the diode is discovered.

15. The transceiver of claim 11, further comprising a communications connector adapted to couple to an electronic component, the microprocessor further configured to notify an electronic component connected to the communication connector when damage to the diode is discovered.

16. A transceiver module comprising:
    a laser diode, wherein the laser diode comprises a vertical cavity surface emitting laser (VCSEL);
    a laser driver coupled to the laser diode;
    a microprocessor coupled to the laser driver;
    memory coupled to the microprocessor, the memory comprising a reference operating characteristic of the laser diode;
    wherein the microprocessor is adapted to collect periodic operating characteristics of the laser diode and to compare the periodic operating characteristics of the laser diode to the reference operating characteristics of the laser diode; and
    wherein the laser diode and laser driver are arranged such that the laser driver can bias the laser diode through two alternate paths, wherein one of the paths includes a pair of switches arranged to enable selective coupling of the laser driver to the laser diode.

17. A method for screening optical transceiver modules for electrostatic discharge damage, the method being performed in connection with an optical transceiver module that includes a laser diode, and the method comprising:
    defining reference operating characteristics of the laser diode, wherein the laser diode comprises a vertical cavity surface emitting laser (VCSEL);
    storing the reference operating characteristics of the laser diode, wherein the reference operating characteristics are stored as quadratic spline coefficients;

periodically collecting operating characteristics of the laser diode;

comparing the collected operating characteristics of the laser diode with the reference operating characteristics of the laser diode; and if damage to the laser diode is discovered, setting a fault flag.

18. The method as recited in claim 17, wherein the periodically collected operating characteristics of the laser diode comprise current/voltage characteristics.

19. The method as recited in claim 17, wherein the periodically collected operating characteristics of the laser diode comprise current versus optical power characteristics.

20. The method as recited in claim 17, wherein the periodically collected operating characteristics of the laser diode are collected when a forward bias voltage is applied to the laser diode.

21. The method as recited in claim 20, wherein the periodically collected operating characteristics of the laser diode comprise at least one of: cut-in voltage; and, forward threshold voltage.

22. The method as recited in claim 17, wherein the periodically collected operating characteristics of the laser diode are collected when a reverse bias voltage is applied to the laser diode.

23. The method as recited in claim 22, wherein the periodically collected operating characteristics of the laser diode comprise at least one of: breakdown voltage; reverse bias knee; and, reverse threshold voltage.

24. The method as recited in claim 17, wherein periodically collecting operating characteristics of the laser diode comprises:

varying a voltage across the laser diode; and measuring a current through the laser diode.

25. The method as recited in claim 17, wherein at least a portion of the method is performed in response to the occurrence of a predefined event.

26. The method as recited in claim 17, further comprising performing a polling routine in response to a setting of the fault flag.

27. The method as recited in claim 17, wherein after a calibration of a laser driver associated with the laser diode is performed, current/voltage characteristics of the laser diode are measured by sweeping each section of an I-V curve while controlling the DC bias on the laser diode.

28. A method for screening optical transceiver modules for electrostatic discharge damage, the method being performed in connection with an optical transceiver module that includes a laser diode, and the method comprising:

defining reference operating characteristics of the laser diode, wherein the laser diode comprises a vertical cavity surface emitting laser (VCSEL);

storing the reference operating characteristics of the laser diode, wherein the periodically collected operating characteristics of the laser diode are stored as cubic spline coefficients;

periodically collecting operating characteristics of the laser diode;

comparing the collected operating characteristics of the laser diode with the reference operating characteristics of the laser diode; and if damage to the laser diode is discovered, setting a fault flag.

* * * * *

UNITED STATES PATENT AND TRADEMARK OFFICE
CERTIFICATE OF CORRECTION

PATENT NO. : 7,440,865 B1
APPLICATION NO. : 10/771083
DATED : October 21, 2008
INVENTOR(S) : Rudolf J. Hofmeister et al.

It is certified that error appears in the above-identified patent and that said Letters Patent is hereby corrected as shown below:

Col. 4
Line 17 change "the forward the forward" to --the forward--

Col. 6
Line 15 change "380" to --308--
Line 19 change "212" to --312--
Line 21 change "212" to --312--

Signed and Sealed this

Twenty-third Day of February, 2010

David J. Kappos
*Director of the United States Patent and Trademark Office*